(12) United States Patent
Rusch-Ihwe

(10) Patent No.: US 8,311,096 B2
(45) Date of Patent: Nov. 13, 2012

(54) METHOD AND DEVICE FOR CONTINUOUS ADAPTATION OF CODING PARAMETERS TO A VARIABLE USER-DATA RATE

(75) Inventor: Jens Rusch-Ihwe, Brandenburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 673 days.

(21) Appl. No.: 12/512,704

(22) Filed: Jul. 30, 2009

(65) Prior Publication Data
US 2010/0254449 A1 Oct. 7, 2010

(30) Foreign Application Priority Data

Apr. 7, 2009 (DE) .......................... 10 2009 016 754
Jun. 17, 2009 (DE) .......................... 10 2009 025 219

(51) Int. Cl.
*H04N 7/04* (2006.01)
(52) U.S. Cl. ............................. 375/240.02; 375/240.03
(58) Field of Classification Search ............... 375/240.02
See application file for complete search history.

(56) References Cited

U.S. PATENT DOCUMENTS

| | | | |
|---|---|---|---|
| 5,216,503 A | 6/1993 | Paik et al. | |
| 5,506,844 A | 4/1996 | Rao | |
| 5,614,914 A | 3/1997 | Bolgiano et al. | |
| 5,903,574 A | 5/1999 | Lyons | |
| 6,005,605 A | 12/1999 | Kostreski et al. | |
| 6,088,337 A | 7/2000 | Eastmond et al. | |
| 6,130,898 A | 10/2000 | Kostreski et al. | |
| 6,192,070 B1 | 2/2001 | Poon et al. | |
| 6,269,092 B1 | 7/2001 | Schilling | |
| 6,313,885 B1 | 11/2001 | Patel et al. | |
| 6,324,186 B1 | 11/2001 | Mahn | |
| 6,414,720 B1 | 7/2002 | Tsukidate et al. | |
| 6,477,180 B1 | 11/2002 | Aggarwal et al. | |
| 6,480,236 B1 | 11/2002 | Limberg | |
| 6,496,477 B1 | 12/2002 | Perkins et al. | |
| 6,631,491 B1 | 10/2003 | Shibutani et al. | |
| 6,640,239 B1 | 10/2003 | Gidwani | |
| 6,721,337 B1 | 4/2004 | Kroeger et al. | |

(Continued)

FOREIGN PATENT DOCUMENTS

DE 199 60 295 6/2001

(Continued)

OTHER PUBLICATIONS

ATSC Digital Television Standard (A/53), "Annex D: RF/Transmission Systems Characteristics", Sep. 16, 1995, pp. 46-60.

(Continued)

*Primary Examiner* — Sath V Perungavoor
*Assistant Examiner* — Maria Vazquez Colon
(74) *Attorney, Agent, or Firm* — Fitzpatrick, Cella, Harper & Scinto

(57) ABSTRACT

A method and a device for continuous adaptation of coding parameters to a variable user-data rate of a datastream composed of data frames. Data packets and ensembles are received and associated with services for mobile receivers. The transmission requirement of the next ensemble is determined based on the buffered data packets. Optimized coding parameters for the ensemble in the next data frame are then determined based on certain factors, such as the transmission requirement for the un-coded ensemble and the determined transmission capacity.

14 Claims, 10 Drawing Sheets

U.S. PATENT DOCUMENTS

| | | | |
|---|---|---|---|
| 6,727,847 B2 | 4/2004 | Rabinowitz et al. | |
| 6,728,467 B2 | 4/2004 | Oshima | |
| 6,772,434 B1 | 8/2004 | Godwin | |
| 6,801,499 B1 | 10/2004 | Anandakumar et al. | |
| 6,804,223 B2 | 10/2004 | Hoffmann et al. | |
| 6,816,204 B2 | 11/2004 | Limberg | |
| 6,861,964 B2 | 3/2005 | Breti et al. | |
| 6,862,707 B2 | 3/2005 | Shin | |
| 6,879,720 B2 | 4/2005 | Sarachik et al. | |
| 6,930,983 B2 | 8/2005 | Perkins et al. | |
| 6,996,133 B2 | 2/2006 | Bretl et al. | |
| 7,110,048 B2 | 9/2006 | Weiss | |
| 7,111,221 B2 | 9/2006 | Birru et al. | |
| 7,197,685 B2 | 3/2007 | Limberg | |
| 7,310,354 B2 | 12/2007 | Fimoff et al. | |
| 7,324,545 B2 | 1/2008 | Chuah et al. | |
| 7,336,646 B2 | 2/2008 | Muller | |
| 7,349,675 B2 | 3/2008 | Karr et al. | |
| 7,382,838 B2 | 6/2008 | Peting | |
| 7,496,094 B2 | 2/2009 | Gopinath et al. | |
| 7,532,677 B2 | 5/2009 | Simon | |
| 7,532,857 B2 | 5/2009 | Simon | |
| 7,539,247 B2 | 5/2009 | Choi et al. | |
| 7,551,675 B2 | 6/2009 | Kroeger | |
| 7,554,912 B2 * | 6/2009 | Rodriguez-Sanchez et al. | 370/232 |
| 7,558,279 B2 | 7/2009 | Hwang et al. | |
| 7,564,905 B2 | 7/2009 | Park et al. | |
| 7,593,474 B2 | 9/2009 | Jeong et al. | |
| 7,599,348 B2 | 10/2009 | Kang et al. | |
| 7,667,780 B2 | 2/2010 | Weiss | |
| 7,702,337 B2 | 4/2010 | Vare et al. | |
| 7,715,491 B2 | 5/2010 | Yu et al. | |
| 7,733,819 B2 | 6/2010 | Lee et al. | |
| 7,779,327 B2 | 8/2010 | Lee et al. | |
| 7,783,316 B1 | 8/2010 | Mitchell | |
| 7,801,181 B2 | 9/2010 | Song et al. | |
| 7,804,909 B2 | 9/2010 | Choi et al. | |
| 7,822,134 B2 | 10/2010 | Kim et al. | |
| 7,830,974 B2 | 11/2010 | Choi et al. | |
| 7,852,961 B2 | 12/2010 | Chang et al. | |
| 7,856,590 B2 | 12/2010 | Kim et al. | |
| 7,933,351 B2 | 4/2011 | Kim et al. | |
| 7,953,160 B2 | 5/2011 | Gordon et al. | |
| 8,009,662 B2 | 8/2011 | Lee et al. | |
| 2001/0017849 A1 | 8/2001 | Campanella et al. | |
| 2002/0085548 A1 | 7/2002 | Ku et al. | |
| 2003/0099303 A1 | 5/2003 | Birru et al. | |
| 2003/0100267 A1 * | 5/2003 | Itoh et al. | 455/69 |
| 2003/0206596 A1 | 11/2003 | Carver et al. | |
| 2005/0013249 A1 | 1/2005 | Kong et al. | |
| 2005/0074074 A1 | 4/2005 | Limberg | |
| 2005/0084023 A1 | 4/2005 | Bott et al. | |
| 2005/0147186 A1 | 7/2005 | Funamoto et al. | |
| 2005/0207416 A1 | 9/2005 | Rajkotia | |
| 2005/0238100 A1 | 10/2005 | Hsiao et al. | |
| 2005/0249300 A1 | 11/2005 | Jeong et al. | |
| 2005/0249301 A1 | 11/2005 | Jeong et al. | |
| 2006/0050770 A1 | 3/2006 | Wallace et al. | |
| 2006/0200852 A1 | 9/2006 | Simon | |
| 2006/0200853 A1 | 9/2006 | Simon | |
| 2006/0244865 A1 | 11/2006 | Simon | |
| 2006/0245516 A1 | 11/2006 | Simon | |
| 2007/0066272 A1 | 3/2007 | Vassiliou et al. | |
| 2007/0143810 A1 | 6/2007 | Yousef | |
| 2007/0174880 A1 | 7/2007 | Fite et al. | |
| 2007/0189410 A1 | 8/2007 | Zeng | |
| 2007/0230460 A1 | 10/2007 | Jeong et al. | |
| 2008/0211969 A1 | 9/2008 | Simon et al. | |
| 2008/0247442 A1 | 10/2008 | Orlik et al. | |
| 2008/0254739 A1 | 10/2008 | Kidd et al. | |
| 2008/0273698 A1 | 11/2008 | Manders et al. | |
| 2009/0003432 A1 | 1/2009 | Liu et al. | |
| 2009/0016435 A1 | 1/2009 | Brandsma et al. | |
| 2009/0034442 A1 * | 2/2009 | Song et al. | 370/310 |
| 2009/0201997 A1 | 8/2009 | Kim et al. | |
| 2009/0228764 A1 | 9/2009 | Lee et al. | |
| 2009/0252266 A1 | 10/2009 | Heinemann et al. | |
| 2009/0265751 A1 | 10/2009 | Limberg | |
| 2010/0254449 A1 | 10/2010 | Rusch-Ihwe | |

FOREIGN PATENT DOCUMENTS

| | | |
|---|---|---|
| DE | 196 17 293 | 11/2001 |
| DE | 101 12 773 | 9/2002 |
| DE | 10 2006 015 393 | 10/2007 |
| DE | 10 2007 012 465 | 5/2008 |
| EP | 0 837 609 | 4/1998 |
| EP | 0 926 894 | 6/1999 |
| EP | 1 079 631 A1 | 2/2001 |
| EP | 1 670 150 | 6/2006 |
| EP | 1 753 249 | 2/2007 |
| EP | 1 950 962 A1 | 7/2008 |
| EP | 1 965 389 A2 | 9/2008 |
| GB | 2 399 719 | 9/2004 |
| WO | WO-02/03728 | 1/2002 |
| WO | WO-03/009590 | 1/2003 |
| WO | WO-03/045064 | 5/2003 |
| WO | WO-2004/062283 | 7/2004 |
| WO | WO-2007/114653 | 10/2004 |
| WO | WO-2006/046107 | 5/2006 |
| WO | WO-2006/066617 | 6/2006 |
| WO | WO-2006/084361 | 8/2006 |
| WO | WO-2007/046672 | 4/2007 |
| WO | WO-2008/042694 | 4/2008 |
| WO | WO-2009/016175 | 2/2009 |
| WO | WO-2010/000407 | 1/2010 |

OTHER PUBLICATIONS

"European Broadcasting Union Union Europeenne de Radio-Television Digital Video Broadcasting (DVB); Specification for Service Information (SI) in DVB systems; ETS 300 468", ETSI Standards, LIS, Sophia Antipolis Cedex, France, vol. BC, Second Edition, Jan. 1, 1997, pp. 1-72.

"ATSC-Mobile DTV Standard, Part 3—Service Multiplex and Transport Subsystem Characteristics", Advanced Television Systems Committee, Inc., Document A/153 Part 3:2009, Oct. 15, 2009, pp. 14-25.

ATSC Digital Television Standard (A/53) Revision E, Advanced Television Systems Committee, Dec. 27, 2005.

ATSC Recommended Practice: Design of Synchronized Multiple Transmitter Networks (A/111), Advanced Television Systems Committee, Sep. 3, 2004.

ATSC Standard: Synchronization Standard for Distributed Transmission (A/110), Advanced Television Systems Committee, Jul. 14, 2004.

ATSC Standard: Synchronization Standard for Distributed Transmission, Revision A (A/110A), Advanced Television Systems Committee, Jul. 19, 2005.

ATSC Standard: Synchronization Standard for Distributed Transmission, Revision B (A/110B), Advanced Television Systems Committee, Dec. 24, 2007.

ATSC Technology Group Report: DTV Signal Reception and Processing Considerations, Doc. T3-600r4, Advanced Television Systems Committee, Sep. 18, 2003.

Battisa, "Spectrally Efficient High Data Rate Waveforms for the UFO SATCOM Channel", Military Communications Conference, MILCOM 98, Proceedings, Oct. 18-21, 1998, pp. 134-139, IEEE vol. 1.

Citta, R., et al., "ATSC Transmission System: VSB Tutorial", Zenith Electronics Corporation, Symposium Handout, Montreuz Symposium, Jun. 12, 1997.

"Digital Video Broadcasting (DVB); DVB Mega-Frame for Single Frequency Network (SFN) Synchronization", European Broadcasting Union; eTSI TS 101 191 v1.4.1, Jun. 2004.

International Preliminary Report on Patentability, PCT/US2006/007265, Oct. 4, 2007.

International Preliminary Report on Patentability, PCT/EP2008/000837, Aug. 6, 2009.

International Preliminary Report on Patentability, PCT/US2006/020599, Nov. 30, 2007.

International Preliminary Report on Patentability, PCT/US2006/022300, Dec. 27, 2007.
International Search Report and Written Opinion of the International Searching Authority, PCT/EP2008/000837, Aug. 12, 2008.
International Search Report and Written Opinion of the International Searching Authority, PCT/US2006/007251, May 20, 2008.
International Search Report and Written Opinion of the International Searching Authority, PCT/US2006/007265, Sep. 4, 2007.
International Search Report and Written Opinion of the International Searching Authority, PCT/US2006/015317, May 14, 2008.
International Search Report and Written Opinion of the International Searching Authority, PCT/US2006/020599, Aug. 31, 2007.
International Search Report and Written Opinion of the International Searching Authority, PCT/US2006/022300, Mar. 29, 2007.
Lecture 4: Digital Television the DVB transport stream, obtained from http://www.abo.fi/~jbjorkqv/digitv/lect4.pdf (last visited May 4, 2006).
Lee, Y., et al., "ATSC Terrestrial Digital Television Broadcasting Using Single Frequency Networks", ETRI Journal, Apr. 2004, pp. 92-100, vol. 26, No. 2.
Owen, H., "Proposed Modifications to ATSC Digital Television Standard to Improve Performance in the Face of Dynamic Multipath for Both Fixed and Mobile Operation", Sarnoff Corporation, Apr. 2, 2001, Princeton, New Jersey.
Patel, C. B., et al., "Proposal to ATSC Subcommittee T3/S9 to Provide 8-VSB With a Repetitive-PN1023 Signal for Rapidly and Reliably Initializing Tracking in an Adaptive Equalizer Despite Adverse Multipath Conditions", Apr. 12, 2001.
Proposal for Enhancement of ATSC RF Transmission System (Revision to A/53), submitted by Samsung, Draft ver. 1.0, Sep. 16, 2004.
Raghunandan, K., "Satellite Digital Audio Radio Service (SDARS) System Architecture and Receiver Review", IEEE, Oct. 27, 2005.
Vogel, W. J., et al., "Propagation Effects and Satellite Radio Design", Paper No. 1445, Maastricht Exhibition and Congress Centre (MECC), Aug. 17-24, 2002, Maastricht, the Netherlands.
Wang, "A New Implementation of Single Frequency Network Based on DMB-T", 2004 International Conference on Communications, Circuits and Systems (2004 ICCCAS), Jun. 27-29, 2004, pp. 246-249, vol. 1.
Wang, X., et al., "Transmitter Identification in Distributed Transmission Network and Its Applications in Position Location and a New Data Transmission Scheme", NAB Broadcast Engineering Conference, Apr. 16-21, 2005, pp. 511-520, Las Vegas, Nevada.
Whitaker, J. C., "Standard Handbook of Video and Television Engineering", Chapter 17.2 "ATSC DTV Received Systems", 2000, pp. 17-63 to 17-99.

* cited by examiner

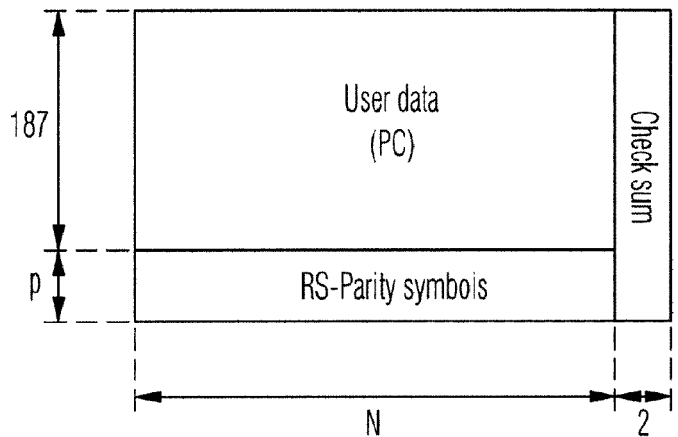
The following applies:
$(187+p) \cdot (N+2) = PL \cdot 5 \cdot NoG$
Fig. 2
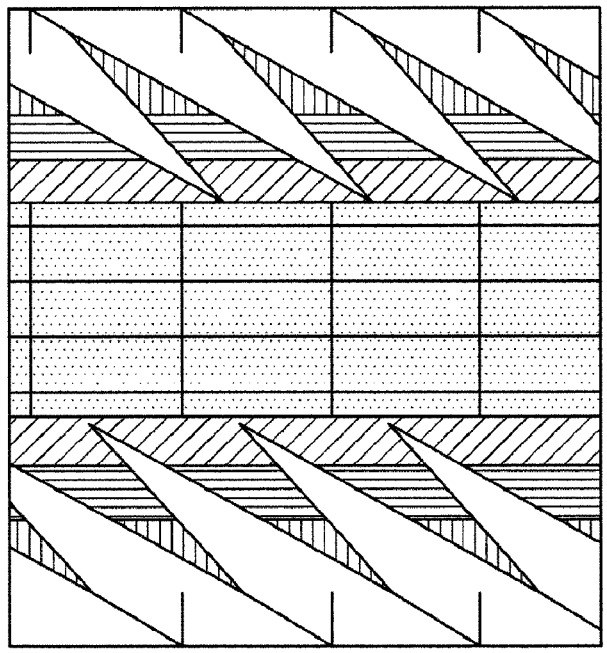
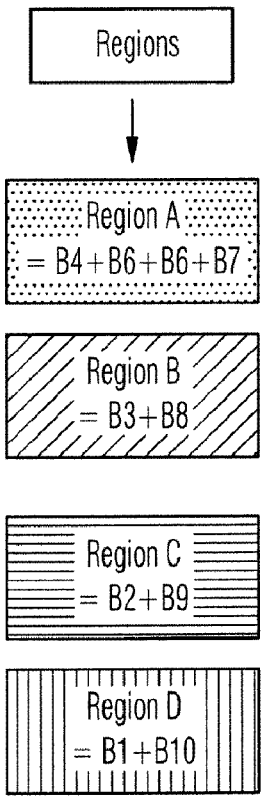
Fig. 3

| SCCC - Convolutional code: | | | | Number of user data bytes |
|---|---|---|---|---|
| Region A | Region B | Region C | Region D | |
| 00 | 00 | 00 | 00 | 9624 |
| 00 | 00 | 00 | 01 | 9372 |
| 00 | 00 | 01 | 00 | 8886 |
| 00 | 00 | 01 | 01 | 8634 |
| 00 | 01 | 00 | 00 | 8403 |
| 00 | 01 | 00 | 01 | 8151 |
| 00 | 01 | 01 | 00 | 7665 |
| 00 | 01 | 01 | 01 | 7413 |
| 01 | 00 | 00 | 00 | 7023 |
| 01 | 00 | 00 | 01 | 6771 |
| 01 | 00 | 01 | 00 | 6285 |
| 01 | 00 | 01 | 01 | 6033 |
| 01 | 01 | 00 | 00 | 5802 |
| 01 | 01 | 00 | 01 | 5550 |
| 01 | 01 | 01 | 00 | 5064 |
| 01 | 01 | 01 | 01 | 4812 |

Legend: 00: Coding rate = $\frac{1}{4}$; 01: Coding rate = $\frac{1}{2}$

Fig. 4A

| SCCC - Coding rate | | | | User-data bytes | Number of ATSC-M/H Timeslots per ATSC-M/H-ensemble and ATSC-M/H data sub-frame | | | | | | | |
|---|---|---|---|---|---|---|---|---|---|---|---|---|
| | | | | | 1 | 2 | 3 | 4 | 5 | 6 | 7 | 8 |
| 1 | 1 | 1 | 1 | 4812 | 112 | 226 | 340 | 454 | 568 | 682 | 796 | 910 |
| 1 | 1 | 1 | 0 | 5064 | 118 | 238 | 358 | 478 | 598 | 718 | 838 | 958 |
| 1 | 1 | 0 | 1 | 5550 | 129 | 261 | 392 | 524 | 655 | 787 | 918 | 1050 |
| 1 | 1 | 0 | 0 | 5802 | 135 | 272 | 410 | 547 | 685 | 822 | 960 | 1097 |
| 1 | 0 | 1 | 1 | 6033 | 140 | 283 | 426 | 569 | 712 | 855 | 998 | 1141 |
| 1 | 0 | 1 | 0 | 6285 | 146 | 295 | 444 | 593 | 742 | 891 | 1040 | 1189 |
| 1 | 0 | 0 | 1 | 6771 | 158 | 318 | 479 | 639 | 800 | 960 | 1121 | 1281 |
| 1 | 0 | 0 | 0 | 7023 | 164 | 330 | 497 | 663 | 830 | 996 | 1162 | 1329 |
| 0 | 1 | 1 | 1 | 7413 | 173 | 349 | 524 | 700 | 876 | 1051 | 1227 | 1403 |
| 0 | 1 | 1 | 0 | 7665 | 179 | 361 | 542 | 724 | 906 | 1087 | 1269 | 1451 |
| 0 | 1 | 0 | 1 | 8151 | 191 | 384 | 577 | 770 | 963 | 1156 | 1350 | 1543 |
| 0 | 1 | 0 | 0 | 8403 | 197 | 396 | 595 | 794 | 993 | 1192 | 1391 | 1590 |
| 0 | 0 | 1 | 1 | 8634 | 202 | 407 | 611 | 816 | 1020 | 1225 | 1430 | 1634 |
| 0 | 0 | 1 | 0 | 8886 | 208 | 419 | 629 | 840 | 1050 | 1261 | 1471 | 1682 |
| 0 | 0 | 0 | 1 | 9372 | 220 | 442 | 664 | 886 | 1108 | 1330 | 1552 | 1774 |
| 0 | 0 | 0 | 0 | 9624 | 226 | 454 | 682 | 910 | 1138 | 1366 | 1594 | 1822 |

Legend: 00: Coding rate = $\frac{1}{4}$; 01: Coding rate = $\frac{1}{2}$
With Reed-Solomon code with 24 parity symbols

Fig. 4B

| Syntax | Number of bits |
|---|---|
| TPC_data: | |
|     Data sub-frame number | 3 |
|     Timeslot number | 4 |
|     Parade identifier | 7 |
|     Starting ATSC-M/H group number | 4 |
|     Number of ATSC-M/H groups-1 | 3 |
|     Parade repetition cycle-1 | 3 |
|     Reed-Solomon data frame mode | 2 |
|     Coding mode of the first Reed-Solomon data frame | 2 |
|     Coating mode of the second Reed-Solomon data frame | 2 |
|     SCCC block mode | 2 |
|     Mode of the SCCC coding for region a | 2 |
|     Mode of the SCCC coding for region b | 2 |
|     Mode of the SCCC coding for region c | 2 |
|     Mode of the SCCC coding for region d | 2 |
|     FIC-version | 5 |
|     Running counter for parade | 4 |
|     Total number of ATSC-M/H groups | 5 |
|     Reserved | 21 |
|     TPC protocol version | 5 |

Fig. 6

| Coding rate for SCCC | | | | RS-Code 24 Parity symbols | RS-Code 36 Parity symbols | RS-Code 48 Parity symbols | RS-Code 24 Parity symbols | RS-Code 36 Parity symbols | RS-Code 48 Parity symbols |
|---|---|---|---|---|---|---|---|---|---|
| 1 | 1 | 1 | 1 | 63.206 | 59.653 | 56.661 | 62,13% | 58,64% | 55,70% |
| 1 | 1 | 1 | 0 | 66.572 | 62.832 | 59.653 | 65,44% | 61,76% | 58,64% |
| 1 | 1 | 0 | 1 | 72.930 | 69.003 | 65.450 | 71,69% | 67,83% | 64,34% |
| 1 | 1 | 0 | 0 | 76.296 | 72.182 | 68.442 | 75,00% | 70,96% | 67,28% |
| 1 | 0 | 1 | 1 | 79.288 | 74.987 | 71.247 | 77,94% | 73,71% | 70,04% |
| 1 | 0 | 1 | 0 | 82.654 | 78.166 | 74.239 | 81,25% | 76,84% | 72,98% |
| 1 | 0 | 0 | 1 | 89.199 | 84.337 | 80.036 | 87,68% | 82,90% | 78,68% |
| 1 | 0 | 0 | 0 | 92.565 | 87.516 | 83.028 | 90,99% | 86,03% | 81,62% |
| 0 | 1 | 1 | 1 | 97.614 | 92.378 | 87.703 | 95,96% | 90,81% | 86,21% |
| 0 | 1 | 1 | 0 | 100.980 | 95.557 | 90.695 | 99,26% | 93,93% | 89,15% |
| 0 | 1 | 0 | 1 | 107.525 | 101.728 | 96.492 | 105,70% | 100,00% | 94,85% |
| 0 | 1 | 0 | 0 | 110.891 | 104.907 | 99.484 | 109,01% | 103,13% | 97,79% |
| 0 | 0 | 1 | 1 | 113.883 | 107.712 | 102.289 | 111,95% | 105,88% | 100,55% |
| 0 | 0 | 1 | 0 | 117.249 | 110.891 | 105.281 | 115,26% | 109,01% | 103,49% |
| 0 | 0 | 0 | 1 | 123.794 | 117.062 | 111.078 | 121,69% | 115,07% | 109,19% |
| 0 | 0 | 0 | 0 | 127.160 | 120.241 | 114.070 | 125,00% | 118,20% | 112,13% |

- Nominal configuration for the ensemble
- SCCC, high error control
- RS, high error control
- Both adjusted, high error control

- SCCC, low error control
- RS Kode, low error control
- Both adjusted, low error control

- Effect not clear, not used

Fig. 8

| Coding rate for SCCC | | | | Number of ATSC-M/H timeslots per ATSC-M/H data sub-frame | | | | | | | |
|---|---|---|---|---|---|---|---|---|---|---|---|
| | | | | 1 | 2 | 3 | 4 | 5 | 6 | 7 | 8 |
| 1 | 1 | 1 | 1 | 20570 | 41888 | 63206 | 84524 | 105842 | 127160 | 148478 | 169796 |
| 1 | 1 | 1 | 0 | 21692 | 44132 | 66572 | 89012 | 111452 | 133892 | 156332 | 178772 |
| 1 | 1 | 0 | 1 | 23749 | 48433 | 72930 | 97614 | 122111 | 146795 | 171292 | 195976 |
| 1 | 1 | 0 | 0 | 24871 | 50490 | 76296 | 101915 | 127721 | 153340 | 179146 | 204765 |
| 1 | 0 | 1 | 1 | 25806 | 52547 | 79288 | 106029 | 132770 | 159511 | 186252 | 212993 |
| 1 | 0 | 1 | 0 | 26928 | 54791 | 82654 | 110517 | 138380 | 166243 | 194106 | 221969 |
| 1 | 0 | 0 | 1 | 29172 | 59092 | 89199 | 119119 | 149226 | 179146 | 209253 | 239173 |
| 1 | 0 | 0 | 0 | 30294 | 61336 | 92565 | 123607 | 154836 | 185878 | 216920 | 248149 |
| 0 | 1 | 1 | 1 | 31977 | 64889 | 97614 | 130526 | 163438 | 196163 | 229075 | 261987 |
| 0 | 1 | 1 | 0 | 33099 | 67133 | 100980 | 135014 | 169048 | 202895 | 236929 | 270963 |
| 0 | 1 | 0 | 1 | 35343 | 71434 | 107525 | 143616 | 179707 | 215798 | 252076 | 288167 |
| 0 | 1 | 0 | 0 | 36465 | 73678 | 110891 | 148104 | 185317 | 222530 | 259743 | 296956 |
| 0 | 0 | 1 | 1 | 37400 | 75735 | 113883 | 152218 | 190366 | 228701 | 267036 | 305184 |
| 0 | 0 | 1 | 0 | 38522 | 77979 | 117249 | 156706 | 195976 | 235433 | 274703 | 314160 |
| 0 | 0 | 0 | 1 | 40766 | 82280 | 123794 | 165308 | 206822 | 248336 | 289850 | 331364 |
| 0 | 0 | 0 | 0 | 41888 | 84524 | 127160 | 169796 | 212432 | 255068 | 297704 | 340340 |

Different error control
Identical error control

METHOD AND DEVICE FOR CONTINUOUS ADAPTATION OF CODING PARAMETERS TO A VARIABLE USER-DATA RATE

BACKGROUND OF THE INVENTION

1. Field of the Invention

The present invention generally relates to a method and a device for continuous adaptation of coding parameters to a variable user-data rate, particularly within an ATSC-M/H datastream.

2. Related Art

U.S. Patent Application Publication 2007/0223612, which is hereby incorporated herein in its entirety by reference, describes a datastream with digital TV data configured according to the Advanced Television Systems Committee (ATSC) standard. Digital TV data for mobile receivers can be integrated and transmitted in the same datastream. Advanced Television Systems Committee Mobile/Handheld (ATSC-M/H) data are inserted as data blocks into ATSC-M/H timeslots provided for this purpose by the packet multiplexer of the TV transmitter. An ATSC-M/H timeslot contains either 156 ATSC-M/H transport stream data packets for mobile receivers or 118 ATSC-M/H transport stream data packets for mobile receivers and 38 ATSC-M/H transport stream data packets for stationary receivers.

The ATSC-M/H data packets from several mobile services are combined in an ATSC-M/H ensemble. The data of an ATSC-M/H ensemble are transmitted within an ATSC-M/H data frame in an ATSC-M/H parade. The data in an ATSC-M/H parade are encoded by a Reed-Solomon coder and stored encoded in a Reed-Solomon data frame. The data of an ATSC-M/H parade and accordingly of a Reed-Solomon data frame are distributed within one ATSC-M/H data frame by an interleaver. In each of the five ATSC-M/H data sub-frames associated with each ATSC-M/H data frame, a total of 16 ATSC-M/H timeslots are disposed. The data of one ATSC-M/H parade are stored respectively in an identical number of ATSC-M/H timeslots. Altogether, up to 16 ATSC-M/H parades can be distributed in an ATSC-M/H data frame. For each ATSC-M/H ensemble, up to 8 ATSC-M/H timeslots can be used in one ATSC-M/H data sub-frame. An example for the assignment of several ATSC-M/H parades to the individual ATSC-M/H timeslots of an ATSC-M/H data sub-frame is shown in FIG. 1.

The encoding of the ATSC-M/H data is typically implemented by a concatenated coding. The external coding of the individual ATSC-M/H parade is implemented with a Reed-Solomon coder, which adds to the user-data of the respective ATSC-M/H ensemble. Specifically, the Reed-Solomon coder adds a given number of parity symbols in every ATSC-M/H timeslot occupied by an ATSC-M/H parade and a given number of check-sum bits by a cyclical redundancy check (CRC) over the user-data and the parity symbols of the respective ATSC-M/H parade. An ATSC-M/H parade encoded by Reed-Solomon coding is stored in a Reed-Solomon data frame as shown in FIG. 2.

A Reed-Solomon data frame generated in this manner is composed of several segments of different sizes, which are assigned to several regions according to FIG. 3. Each region is encoded in a convolutional coder following the Reed-Solomon coder, which, together with the trellis coder of the 8-VSB modulator in the ATSC-M/H system, forms a serial concatenated convolutional code (SCCC).

FIG. 4A shows the number of user-data bytes capable of being transmitted in a Reed-Solomon data frame for various combinations of coding rates in the individual regions of an original Reed-Solomon frame. FIG. 4B shows the number of user-data bytes capable of being transmitted per ATSC-M/H timeslot for various combinations of coding rates in the individual regions of an original Reed-Solomon data frame and for various numbers (NoG) of ATSC-M/H timeslots per ATSC-M/H ensemble within an ATSC-M/H data sub-frame.

By varying the coding rate $$\left(\text{e.g. } C = \frac{1}{2} \text{ and } C = \frac{1}{4}\right)$$

of the convolutional coder in every one of the 4 different regions of an ATSC-M/H parade, and by varying the number of parity symbols used (e.g. P=24, 36 and 48) in the case of the Reed-Solomon coder, a total of 48 different stages of error control for an ATSC-M/H parade is obtained.

Accordingly, the user-data rate of an ATSC-M/H ensemble or an ATSC-M/H parade in each ATSC-M/H data frame is dependent upon the error control configuration of the Reed-Solomon coder in the respective ATSC-M/H data frame, the error control configuration of the convolutional coder in the respective ATSC-M/H data frame and the number of ATSC-M/H timeslots provided for the ATSC-M/H ensemble in each of the five ATSC-M/H data sub-frames of the respective ATSC-M/H data frame.

For the transmission of the data from ATSC-M/H ensembles or ATSC-M/H parades, zero-data packets are reserved in the associated ATSC-M/H timeslots of the respective ATSC-M/H data frames within the ATSC-M/H transport datastream. If the transmission capacities of the individual mobile services are temporarily not used, these cannot be provided again to the ATSC data for stationary receivers and remain disadvantageously un-exploited.

The object of the invention is therefore to provide a method and a device in order to exploit in a beneficial manner temporarily unused transmission capacities of individual mobile services in a transport datastream.

SUMMARY OF THE INVENTION

The present invention provides a method and device for continuous adaptation of coding parameters to a variable user-data rate.

In one embodiment, a method for continuous adaptation of coding parameters to a variable user-data rate is provided. The method includes receiving data packets and ensembles and associating them with services for mobile receivers. The transmission requirement of the next ensemble to be transmitted is determined based on the buffered data packets. Optimized coding parameters for the ensemble in the next data frame are then determined based on the transmission requirement for the un-coded ensemble and the determined transmission capacity.

In another embodiment, a device for continuous adaptation of coding parameters to a variable user-data rate is provided. The device includes a control unit, a processing unit, and a multiplexer. The control unit monitors buffered data packets and determines the number of timeslots of the next data frame. The processing unit generates the data associated with the individual timeslots of the next data from the buffered data packets. And the multiplexer generates a datastream with successive data frames.

Further features and advantages of the present invention as well as the structure and operation of various embodiments of the present invention are described in detail below with reference to the accompanying drawings.

BRIEF DESCRIPTION OF THE DRAWINGS

The features and advantages of the present invention will become more apparent from the detailed description set forth below when taken in conjunction with the drawings.

FIG. 2 is a data structure of a Reed-Solomon data frame.

FIG. 3 is a data structure of an ATSC-VSB data frame with ATSC-M/H regions.

FIG. 4A is a table with the number of user-data bytes per Reed-Solomon data frame dependent upon the coding rate of the convolutional code in the regions.

FIG. 4B is a table with the number of user-data bytes transmitted per ATSC-M/H timeslot dependent upon the coding rate of the convolutional code in the regions and the number of ATSC-M/H timeslots per ATSC-M/H ensemble.

FIG. 6 is a table with transmission parameter channel parameters.

FIG. 8 is a table with the number of user-data bytes per Reed-Solomon data frame dependent upon the coding parameters and the number of ATSC-M/H timeslots per ATSC-M/H ensemble.

DETAILED DESCRIPTION

Figure 1:
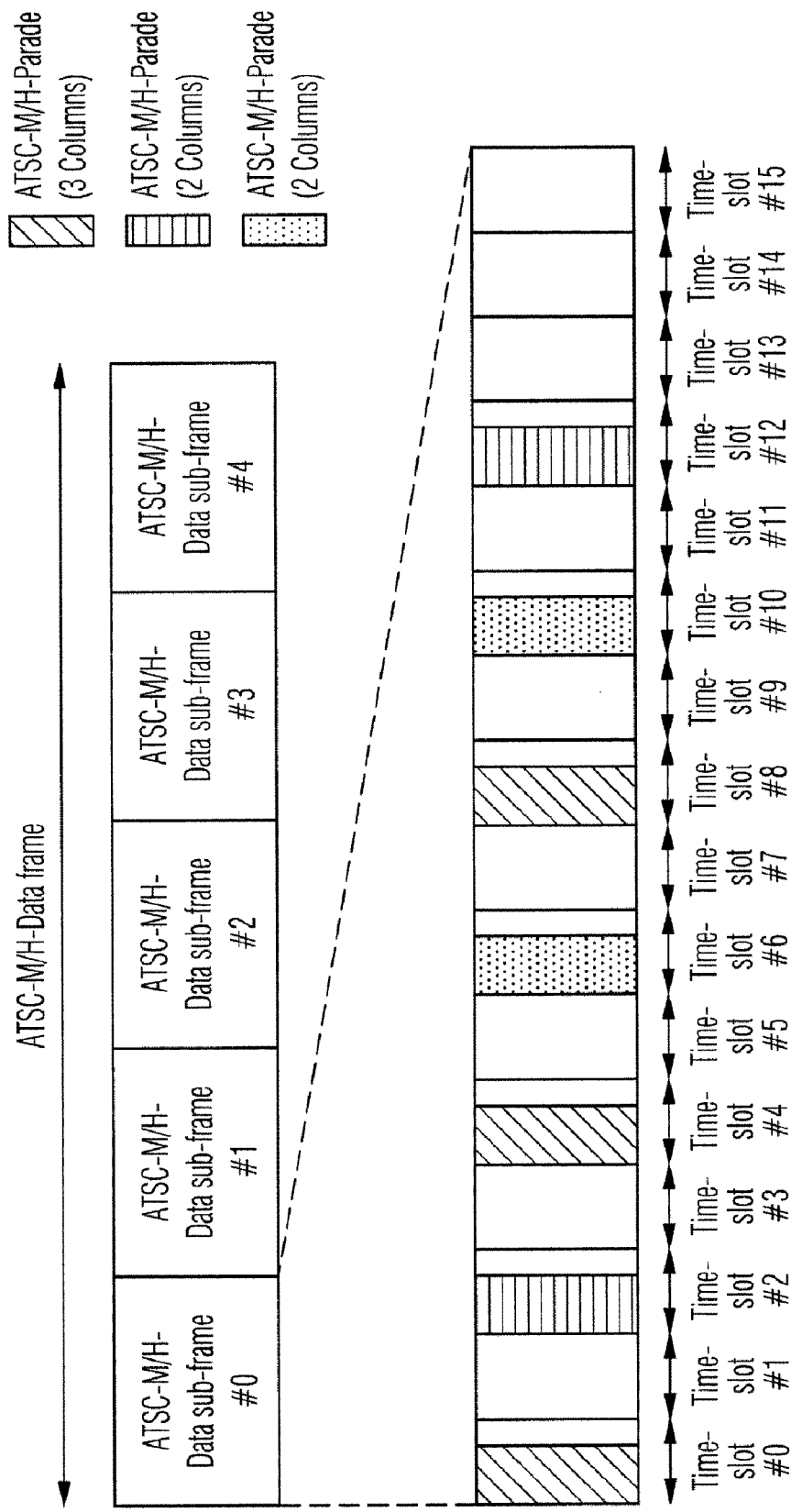
FIG. 1 is a data structure of an ATSC-M/H data frame with data from several ATSC-M/H ensemble/parades.

The present invention is now described in more detail herein in terms of an exemplary method and device for continuous adaptation of coding parameters to a variable user-data rate in a datastream. This is for convenience only and is not intended to limit the application of the present invention. In fact, after reading the following description, it will be apparent to one skilled in the relevant art(s) how to implement the following invention in alternative embodiments.

In an exemplary procedure of the present invention, transmission capacities within the ATSC transport datastream not used by the individual mobile services are exploited to improve the error control of the ATSC-M/H data to be transmitted. The individual coding parameters for every ATSC-M/H ensemble or ATSC-M/H parade are continuously adapted to the variable user-data rate of the ATSC-M/H ensemble or ATSC-M/H parade to be transmitted. In each case, the un-coded ATSC-M/H data of several mobile services integrated in an ATSC-M/H ensemble are buffered in an associated data buffer after their reception.

The transmission requirement for the individual un-coded ATSC-M/H ensemble at the transmission timing point of the respective next ATSC-M/H data frame is determined from the un-coded data volume of the data buffer respectively associated with the individual ATSC-M/H ensemble. The transmission timing point is determined at the end of the transmission period of the second ATSC-M/H data sub-frame of each current ATSC-M/H data frame to be transmitted. Optimized coding parameters for the ATSC-M/H ensemble at the transmission timing point of the next ATSC-M/H data frame are determined from the transmission requirement of an un-coded ATSC-M/H ensemble for the transmission timing point of the next ATSC-M/H data frame. The next highest transmission capacity value for an un-coded ATSC-M/H ensemble in an ATSC-M/H data frame, relative to the transmission requirement of the un-coded ATSC-M/H ensemble for the transmission timing point of the next ATSC-M/H data frame, is sought in tables. In these tables, one transmission-capacity value for an un-coded ATSC-M/H ensemble is stored in an ATSC-M/H data frame at various coding-parameter values and at various transmission-capacity values.

In this manner, the coding parameters for every ATSC-M/H ensemble transmitted in an ATSC-M/H data frame and its associated error control is adapted in an optimal manner to the variable user-data rate of the ATSC-M/H ensemble transmitted in successive ATSC-M/H data frames of the datastream.

To further optimize the coding parameters, the coding rate of a Reed-Solomon coder provided as the external coder and/or the coding rate of the convolutional coder provided as the internal coder is preferably optimized.

The determination of the coding parameters for the individual ATSC-M/H ensemble at the transmission timing point of the next ATSC-M/H data frame is preferably implemented in each case at the end of the transmission period of the second ATSC-M/H data sub-frame of the currently transmitted ATSC-M/H data frame.

If less data are to be transmitted by an ATSC-M/H ensemble for the transmission timing point of the next ATSC-M/H data frame than in the currently transmitted ATSC-M/H data frame, while more data are to be transmitted from another ATSC-M/H ensemble at the transmission timing point of the next ATSC-M/H data frame than in the currently transmitted ATSC-M/H data frame, and both ATSC-M/H ensembles correspond to the same multiple number of five ATSC-M/H timeslots, then the ATSC-M/H timeslots from the ATSC-M/H ensemble with less transmission requirement are preferably made available to the ATSC-M/H ensemble with more transmission requirement at the transmission timing point of the next ATSC-M/H data frame.

If a mobile service in an ATSC-M/H ensemble at the transmission timing point of the next ATSC-M/H data frame has a data transmission requirement which is increased over the transmission timing point of the current ATSC-M/H data frame while another ATSC-M/H ensemble at the transmission timing point of the next ATSC-M/H data frame has sufficient free transmission capacity for the additional transmission requirement of the mobile service, then the mobile service with the increased transmission requirement is assigned by preference to the other ATSC-M/H ensemble at the transmission timing point of the next ATSC-M/H data frame.

The ATSC-M/H parade associated with an ATSC-M/H ensemble within an ATSC-M/H data frame is preferably packed by Reed-Solomon coding in one or two Reed-Solomon data frames. These Reed-Solomon data frames are distributed over the ATSC-M/H timeslots of the five ATSC-M/H data sub-frames of the ATSC-M/H data frame associated with the ATSC-M/H ensemble. In the case of the generation of two Reed-Solomon data frames with different distribution of the user-data to the two Reed-Solomon data frames, different coding rates are preferably used in each case for the two Reed-Solomon data frames. The coding rate and accordingly the level of error control is indirectly proportional to the user-data volume in the respective Reed-Solomon frame.

An exemplary device according to the present invention provides one data buffer for every ATSC-M/H ensemble, in which the data packets associated with the individual ATSC-M/H ensemble are buffered after their reception. A control unit monitors the data volume in every individual data buffer and, starting from the data volume registered in the data buffer at the end of the transmission period of the second ATSC-M/H data sub-frame of the currently transmitted ATSC-M/H data frame, determines the structure and the error control for the individual ATSC-M/H ensemble at the transmission timing point of the next ATSC-M/H data frame. In other words, the control unit determines the number of ATSC-M/H timeslots in the individual ATSC-M/H data sub-frames and the coding rate for every individual ATSC-M/H ensemble. A processor unit configures the data packets of the ATSC-M/H ensembles in the individual ATSC-M/H timeslots of the next ATSC-M/H data frame according to the structuring data determined in the control unit and encodes them corresponding to the error-control data determined in the control unit. A multiplexer generates an ATSC-M/H datastream from the data packets combined in the individual ATSC-M/H times lots.

A functional unit is provided for the distribution of the received data packets, which are associated in each case with the ATSC-M/H ensemble, to the associated data buffers. For example, the ATSC-M/H timeslots associated with the respective ATSC-M/H ensemble and coding parameters is implemented in an associated functional unit for generating the signalization data in a signalization channel in every ATSC-M/H data frame.

Figure 7:
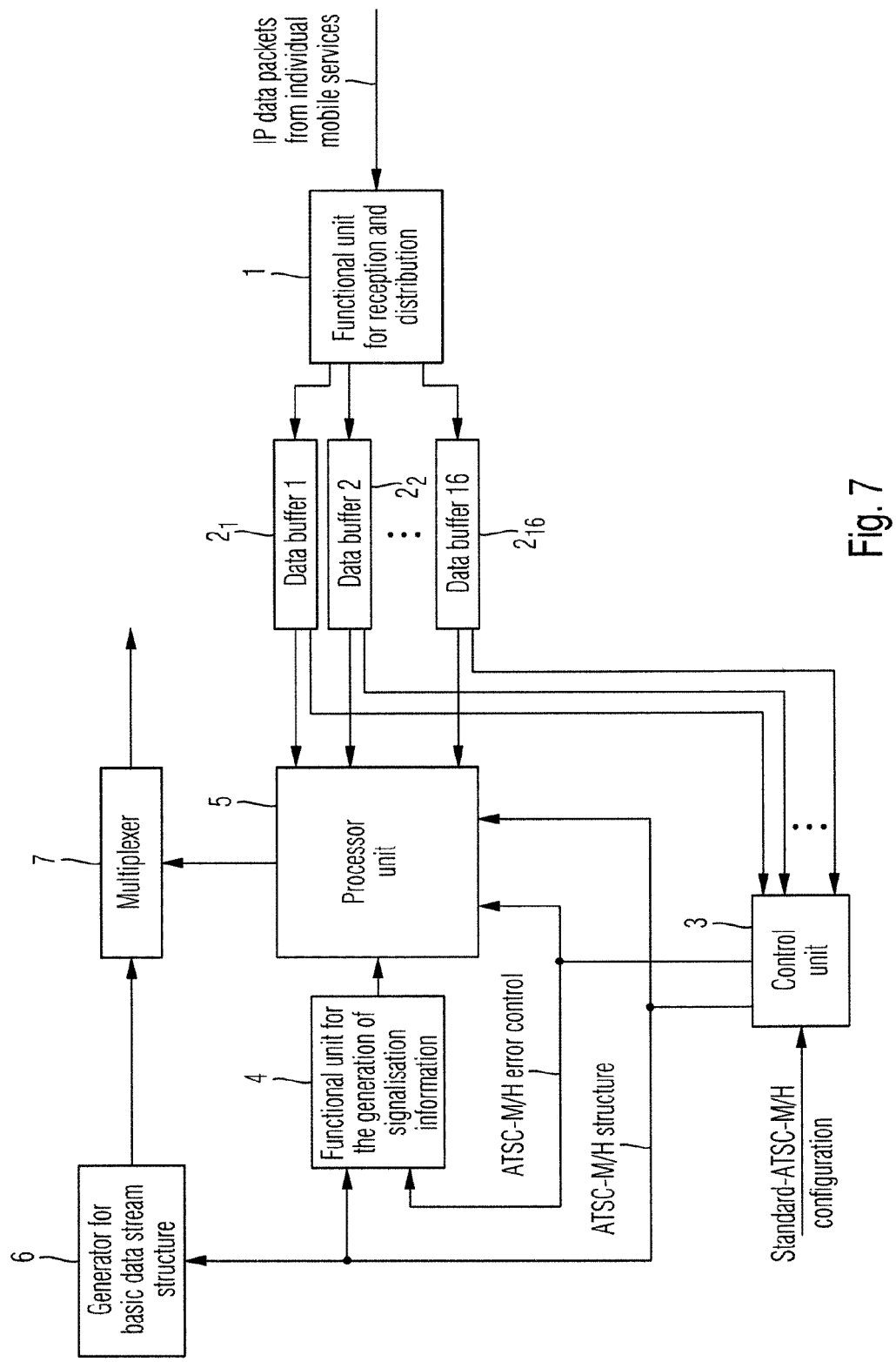
FIG. 7 is a block-circuit diagram of the device according to the present invention for continuous adaptation of coding parameters to a variable user-data rate in an ATSC-M/H datastream.
Figure 10:
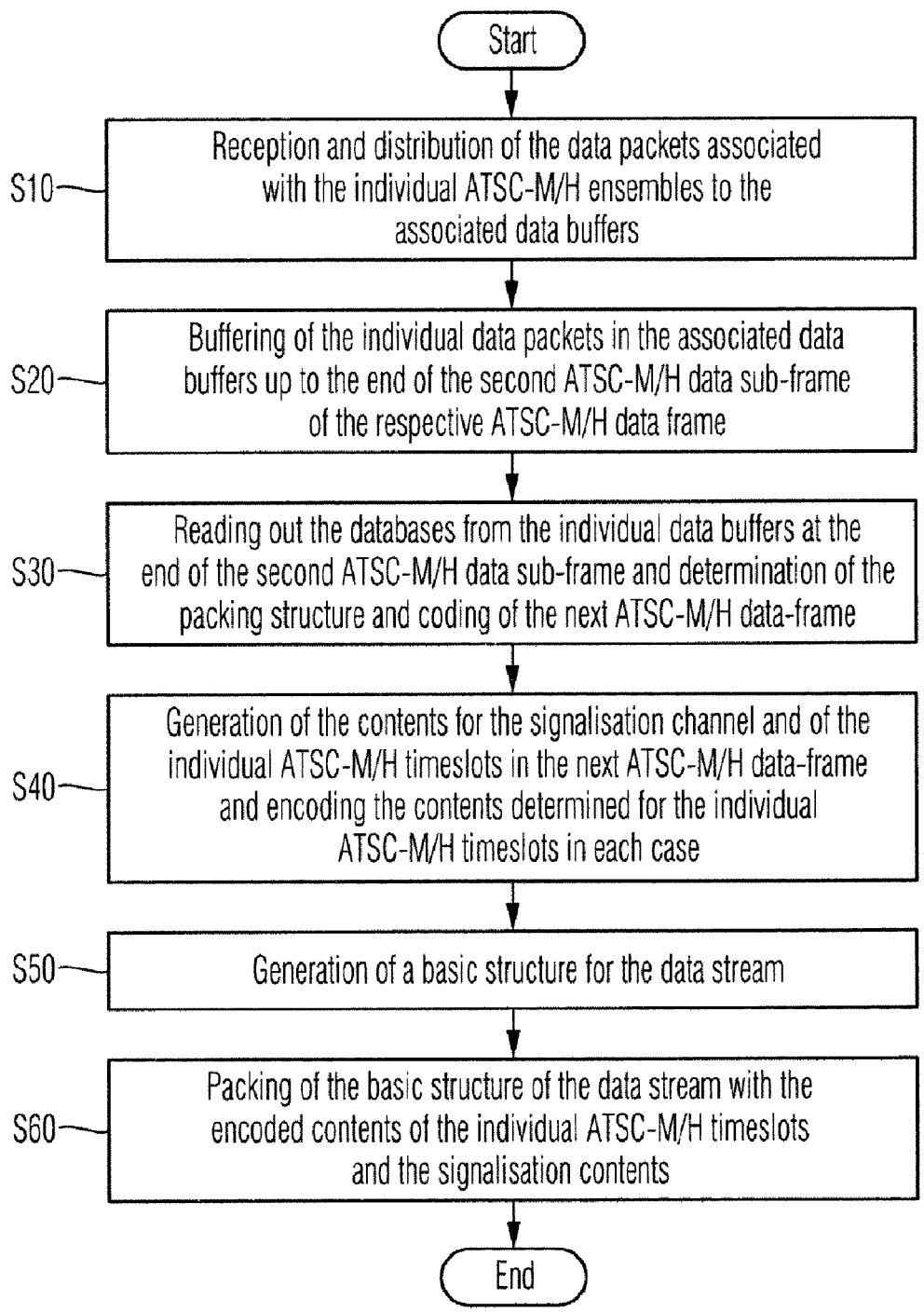
FIG. 10 is a flow chart of the continuous adaptation according to the present invention of coding parameters to a variable user-data rate in an ATSC-M/H datastream.

In the following section, the method and device according to the invention for continuous adaptation of coding parameters to a variable user-data rate in an ATSC-M/H datastream are explained with reference to the flow chart in FIG. 10 and the block-circuit diagram in FIG. 7, respectively.

In the first procedural stage S10, the individual internet protocol (IP) data packets, which are MPEG4 source-coded and have been generated by the individual services or channels for mobile receivers (collectively "mobile services"), are received and distributed in a functional unit for the reception and distribution of data packets 1. The data packets are distributed to the ATSC-M/H data buffer $(2_1, 2_2, \ldots, 2_{16})$ associated with the respective ATSC-M/H ensemble. The first procedural stage S10 occurs in the pre-processor, which is disposed in the head-end of a digital TV transmission system. Since up to 16 ATSC-M/H ensembles or ATSC-M/H parades can be transmitted in each case in one ATSC-M/H data frame, a total of 16 data buffers $(2_1, 2_2, \ldots, 2_{16})$ are provided.

The coding of the data packets associated with one ATSC-M/H ensemble or one ATSC-M/H parade is implemented by Reed-Solomon coding in a Reed-Solomon data frame. The Reed-Solomon frames are ready-packed, and are not coded in an incremental manner. The coding parameters for the decoding of the next ATSC-M/H data frame to be transmitted respectively are transmitted in the signalization channel of the last three ATSC-M/H data sub-frames of the current ATSC-M/H data frame to be transmitted, as shown in the upper time-flow diagram in FIG. 5. The individual IP data packets associated with the respective ATSC-M/H ensemble and determined for transmission in the next ATSC-M/H data frame are buffered in the associated data buffers $(2_1, 2_2, \ldots, 2_{16})$ up to a timing point, according to procedural stage S20. The timing point is disposed, according to the lower time-flow diagram in FIG. 5, at the end of the second ATSC-M/H data sub-frame of the current ATSC-M/H data frame to be transmitted. In other words, the timing point is disposed by 3 ATSC-M/H data sub-frames with the addition of the processing time for the generation of the signalization and user-data for the second ATSC-M/H data sub-frame of the current ATSC-M/H data frame to be transmitted, relative to the start of transmission of the next ATSC-M/H data frame. The data packets from the individual data buffers $(2_1, 2_2, \ldots, 2_{16})$ are deleted after they are read.

In the next procedural stage S30 the databases of the individual data buffers $(2_1, 2_2, \ldots, 2_{16})$ read out at the end of the transmission period of the second ATSC-M/H data sub-frame and are used by a control unit 3 to determine the configuration data of the next ATSC-M/H data frame. In other words, the individual data buffers $(2_1, 2_2, \ldots, 2_{16})$ are used to determine the number of ATSC-M/H timeslots associated with the ATSC-M/H ensembles or ATSC-M/H parades in the ATSC-M/H data sub-frames of the next ATSC-M/H data frame as well as the coding parameters associated with the ATSC-M/H ensembles or ATSC-M/H parades for the external Reed-Solomon coder and the internal SCCC.

Figure 9:
FIG. 9 is a table with the number of user-data bytes per Reed-Solomon data frame dependent upon the number of ATSC-M/H timeslots per ATSC-M/H ensemble.

As shown in FIG. 8 and FIG. 9, the optimized configuration for the next ATSC-M/H data frame is determined by an algorithm in previously-determined tables and stored in an internal memory of the control unit 3. The optimized configuration is determined on the basis of the number of user-data bytes which is determined in each case for the ATSC-M/H ensembles or ATSC-M/H parades and for the next ATSC-M/H data frame to be transmitted. The table elements in FIG. 8 and FIG. 9 contain the associated number of user-data bytes per Reed-Solomon data frame and accordingly per ATSC-M/H ensemble in one ATSC-M/H data frame as a function of individual coding parameters and individual transmission capacities. The transmission capacity is the number of ATSC-M/H timeslots provided for an ATSC-M/H ensemble in every ATSC-M/H data sub-frame. In the case of FIG. 8, the individual coding parameters are the coding parameters of the external Reed-Solomon coder and of the internal convolutional coder, and the transmission capacity is 3 ATSC-M/H timeslots per ATSC-M/H ensemble. In the case of FIG. 9, the individual coding parameters are the coding parameters of the internal convolutional coder, and the transmission capacity is 1 to 8 ATSC-M/H timeslots per ATSC-M/H ensemble.

The algorithm searches for the table element which contains the next lowest number of user-data bytes to the determined number of user-data bytes. From the determined table element, the associated configuration data are obtained. Associated configuration data includes the coding parameters for the Reed-Solomon code and the SCCC and the associated transmission capacity as a number of ATSC-M/H timeslots for each ATSC-M/H ensemble in the respective ATSC-M/H data frame. The algorithm checks whether the determined coding parameters are disposed within lower and upper limit values. Otherwise, the error control is automatically adapted by the algorithm to the lower or higher threshold limit.

In the next procedural stage S40, the signalization information for every ATSC-M/H data frame, and therefore also the configuration data generated by the control unit 3 for the current ATSC-M/H data frame to be transmitted and for the next ATSC-M/H data frame, are stored. The data are stored by a functional unit for the generation of signalization information 4, in a signalization channel. In a preferred embodiment, the signalization channel is a "transmission parameter channel" (TPC), which is generated in parallel to the user-data channel of the individual ATSC-M/H data frame.

FIG. 6 provides an overview of the content and the size of every individual item of signalization information in a TPC. These items of signalization information are transmitted over the duration of one ATSC-M/H data sub-frame, which contains ATSC-M/H timeslots with ATSC-M/H data packets.

Figure 5:
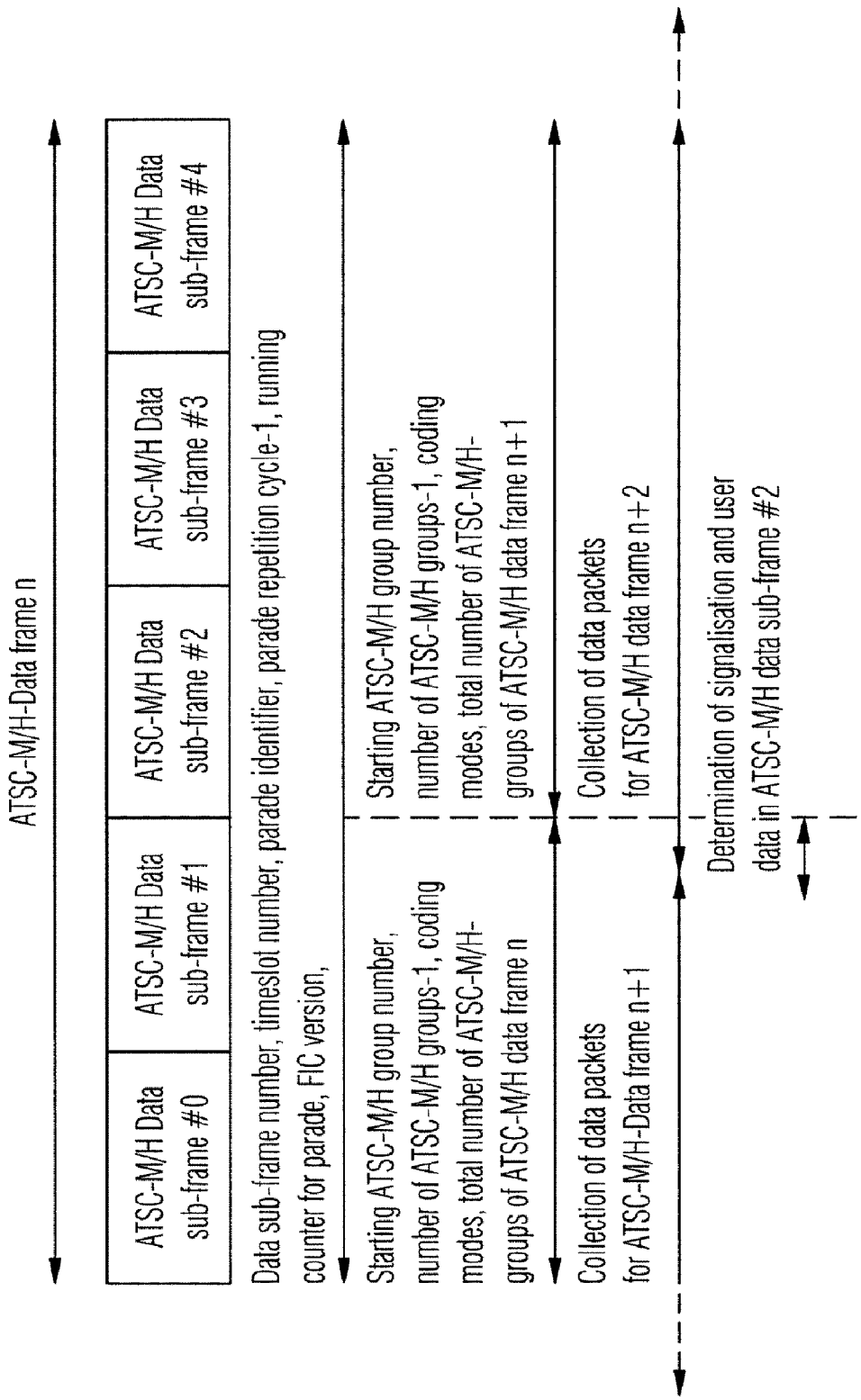
FIG. 5 is a time-flow chart of the configuration of the ATSC-M/H data frame.

FIG. 5 shows the packing structure of a TPC. General signalization information, such as the data sub-frame number or the timeslot number, can be transmitted in all ATSC-M/H data sub-frames. On the other hand, the signalization information required for the structuring of an ATSC-M/H timeslot, such as the total number of ATSC-M/H groups per ATSC-M/H timeslot, and the signalization information required for the coding of the individual ATSC-M/H timeslots, such as the coding modes of the coders used for the current ATSC-M/H data frame to be transmitted, are stored in the first two ATSC-M/H data sub-frames of the current ATSC-M/H data frame to be transmitted. The signalization information for the next ATSC-M/H data frame to be transmitted is stored in the three last ATSC-M/H data sub-frames of the current ATSC-M/H data frame to be transmitted.

In this manner, it is possible for the receiver to implement a decoding of the currently received ATSC-M/H data frame at the start of the currently received ATSC-M/H data frame. Moreover, this kind of organization of the signalization information allows the configuration to be easily amended for the error control and for the packing structure of the individual ATSC-M/H timeslots to the individual ATSC-M/H ensembles or ATSC-M/H parades from ATSC-M/H data frame to ATSC-M/H data frame. However, the prerequisite for this kind of organization of the signalization information is that every ATSC-M/H ensemble or every ATSC-M/H parade is transmitted in every ATSC-M/H data frame. An ATSC-M/H ensemble or and ATSC-M/H parade which is transmitted only in every second to eighth ATSC-M/H data frame is prohibited in this context.

Moreover, in procedural stage S40, a processor unit 5 packs the data packets of the current ATSC-M/H ensemble to be transmitted into the ATSC-M/H timeslots associated with the respective ATSC-M/H ensemble for the individual ATSC-M/H data sub-frames of the next ATSC-M/H data frame to be transmitted, starting from the configuration data generated in the control unit 3. The data packets of the respective current ATSC-M/H ensemble are stored in the individual data buffers $(2_1, 2_2, \ldots, 2_{16})$ up to the timing point of the transmission end of the second ATSC-M/H data sub-frame.

In the next procedural stage S50, an ATSC datastream with a basic structure is generated without transmission contents by a generator for a basic datastream structure 6. The basic structure also contains ATSC-M/H data frames with 5 ATSC-M/H data sub-frames per data frame and an ATSC-M/H timeslot structure corresponding to the configuration data determined by the control unit 3.

In the next procedural stage S60, the data packets of the ATSC-M/H ensembles or ATSC-M/H parades provided by the processor unit 5 for the individual ATSC-M/H timeslots in the individual ATSC-M/H data sub-frame of the ATSC-M/H data frame to be transmitted are packed, in a multiplexer 7, into this basic structure of an ATSC datastream generated in the above manner.

An ATSC-M/H datastream generated in this manner by the multiplexer 7 is transmitted from the pre-processor of the head-end to the individual post-processors in the transmitters of the ATSC system.

Instead of searching for optimized configuration data for the individual ATSC-M/H data frames in previously determined tables, the use of transmission characteristics, which have been previously determined by simulation or experimentation, is also covered by the present invention. Furthermore, the invention is not restricted to ATSC or ATSC-M/H. Other standards such as DVB-T or DVB-S can also be used.

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. Thus, the present invention should not be limited by any of the above described exemplary embodiments, but should be defined only in accordance with the following claims and their equivalents.

In addition, it should be understood that the figures illustrated in the attachments, which highlight the functionality and advantages of the present invention, are presented for example purposes only. The architecture of the present invention is sufficiently flexible and configurable, such that it may be utilized (and navigated) in ways other than that shown in the accompanying figures.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

What is claimed is:

1. A method for continuous automatic adaptation of coding parameters to a variable user-data rate of a datastream composed of data frames, comprising:
   buffering, in a data buffer, data packets received and associated with individual services for mobile receivers and an ensemble associated with the respective service;
   determining, based on the data packets buffered in the data buffer, a transmission requirement of a respective ensemble for a next data frame in the datastream to be configured;
   determining optimized coding parameters for the respective ensemble in the next data frame to be transmitted dependent upon a transmission requirement determined for the respective un-coded ensemble in the next data frame to be transmitted and a transmission capacity provided for the respective un-coded ensemble in the next data frame to be transmitted,
   wherein the optimized coding parameters are determined by seeking a next highest transmission-capacity value for an un-coded ensemble in a data frame relative to the transmission requirement of the un-coded ensemble in tables, in which for various transmission-capacity values for an un-coded ensemble within a data frame and for various coding-parameter values, a previously-determined transmission-capacity value for an un-coded ATSC M/H ensemble is stored in a data frame.

2. The method according to claim 1, wherein the optimization of the coding parameters includes at least one of optimization of the coding rate of the Reed-Solomon code used as the external code of the data frame and optimization of the coding rate of the convolutional code used as the internal code of the data frame.

3. The method according to claim 1, wherein the data packets associated with an ensemble within one data frame are coded according to the Reed-Solomon code and integrated in up to two Reed-Solomon data frames of the parade associated with the ensemble, and the two Reed-Solomon data frames of one parade are coded in each case with a different coding rate dependent upon the user-data volume packed in the respective Reed-Solomon data frame.

4. The method according to claim 1, wherein a mobile service with an increased transmission requirement at a transmission timing point of the next data frame is removed from the ensemble at the transmission timing point of the next data frame and integrated into another ensemble with a free transmission capacity corresponding to an increased transmission requirement of the mobile service at the transmission timing point of the next data frame.

5. The method according to claim 1, wherein
each data frame is an ATSC-M/H data frame and/or
each sub-frame is an ATSC-M/H sub-frame and/or
each data packet is an ATSC-M/H data packet and/or
each ensemble is an ATSC-M/H ensemble and/or
each timeslot is an ATSC-M/H timeslot and/or
each parade is an ATSC-M/H parade.

6. A device for continuous adaptation of coding parameters to a variable user-data rate of a datastream composed of data frames with a number of data buffers corresponding to a number of mobile services for buffering of data packets to be transmitted for a respective mobile service, comprising:
a control unit for monitoring the data packets buffered in the individual data buffers and for determining a number of timeslots of a next data frame to be transmitted for every ensemble composed of data packets of at least one mobile service and a coding parameter associated with the respective ensemble,
a processing unit for generating data associated with the individual timeslots of the next data frame to be transmitted from the data packets buffered in the individual data buffers, and
a multiplexer for generating a datastream with successive data frames from the timeslots filled with data,
wherein the coding parameter is determined by seeking a next highest transmission-capacity value for an un-coded ensemble in a data frame relative to a transmission requirement of an un-coded ensemble in tables, in which for various transmission-capacity values for an un-coded ensemble within a data frame and for various coding-parameter values, a previously-determined transmission-capacity value for an un-coded ATSC M/H ensemble is stored in a data frame.

7. The device according to claim 6, wherein a functional unit for receiving data packets associated with the individual mobile services and for the distribution of the data packets to the individual data buffers is provided.

8. The device according to claim 6, wherein a functional unit for generating a signalization channel for every data frame with the number of timeslots established for every ensemble by the control unit and associated coding parameters is provided.

9. The device according to claim 6, wherein
each data frame is an ATSC-M/H data frame and/or
each sub-frame is an ATSC-M/H sub-frame and/or
each data packet is an ATSC-M/H data packet and/or
each ensemble is an ATSC-M/H ensemble and/or
each timeslot is an ATSC-M/H timeslot and/or
each parade is an ATSC-M/H parade.

10. A non-transitory computer-readable medium encoded with a computer program, which, when executed by a processor, causes the processor to perform the method according to claim 1.

11. A method for continuous automatic adaptation of coding parameters to a variable user-data rate of a datastream composed of data frames, comprising:
buffering, in a data buffer, data packets received and associated with individual services for mobile receivers and an ensemble associated with the respective service;
determining, based on the data packets buffered in the data buffer, a transmission requirement of a respective ensemble for a next data frame in the datastream to be configured;
determining optimized coding parameters for the respective ensemble in the next data frame to be transmitted dependent upon a transmission requirement determined for the respective un-coded ensemble in the next data frame to be transmitted and a transmission capacity provided for the respective un-coded ensemble in the next data frame to be transmitted,
wherein the optimized coding parameters for the respective ensemble in the next data frame to be transmitted are determined from those data packets, which are buffered in the data buffers, of the associated ensemble up to the end of the transmission period of a second data sub-frame of the current data frame to be transmitted.

12. A method for continuous automatic adaptation of coding parameters to a variable user-data rate of a datastream composed of data frames, comprising:
buffering, in a data buffer, data packets received and associated with individual services for mobile receivers and an ensemble associated with the respective service;
determining, based on the data packets buffered in the data buffer, a transmission requirement of a respective ensemble for a next data frame in the datastream to be configured;
determining optimized coding parameters for the respective ensemble in the next data frame to be transmitted dependent upon a transmission requirement determined for the respective un-coded ensemble in the next data frame to be transmitted and a transmission capacity provided for the respective un-coded ensemble in the next data frame to be transmitted,
wherein for the next data frame, a multiple number of five timeslots, which have so far been assigned to the transmission capacity of an ensemble, are assigned to the transmission capacity of another ensemble, if the reduced transmission requirement of the one ensemble and, at the same time, the increased transmission requirement of the other ensemble corresponds to the transmission capacity of the same multiple number of five timeslots.

13. A device for continuous adaptation of coding parameters to a variable user-data rate of a datastream composed of data frames with a number of data buffers corresponding to a number of mobile services for buffering of data packets to be transmitted for a respective mobile service, comprising:
a control unit for monitoring the data packets buffered in the individual data buffers and for determining a number of timeslots of a next data frame to be transmitted for every ensemble composed of data packets of at least one mobile service and a coding parameter associated with the respective ensemble,
a processing unit for generating a data associated with the individual timeslots of the next data frame to be transmitted from the data packets buffered in the individual data buffers, and
a multiplexer for generating a datastream with successive data frames from the timeslots filled with data,
wherein the coding parameter for the respective ensemble in the next data frame to be transmitted is determined from data packets, which are buffered in the data buffers, of the associated ensemble up to an end of a transmission period of a second data sub-frame of a current data frame to be transmitted.

14. A device for continuous adaptation of coding parameters to a variable user-data rate of a datastream composed of data frames with a number of data buffers corresponding to a number of mobile services for buffering of data packets to be transmitted for a respective mobile service, comprising:
- a control unit for monitoring the data packets buffered in the individual data buffers and for determining a number of timeslots of a next data frame to be transmitted for every ensemble composed of data packets of at least one mobile service and a coding parameter associated with the respective ensemble,
- a processing unit for generating data associated with the individual timeslots of the next data frame to be transmitted from the data packets buffered in the individual data buffers, and
- a multiplexer for generating a datastream with successive data frames from the timeslots filled with data, wherein for the next data frame, a multiple number of five timeslots, which have so far been assigned to a transmission capacity of a first ensemble, are assigned to a transmission capacity of a second ensemble, if a reduced transmission requirement of the first ensemble and, at the same time, an increased transmission requirement of the second ensemble corresponds to the transmission capacity of the same multiple number of five timeslots.

* * * * *

UNITED STATES PATENT AND TRADEMARK OFFICE
CERTIFICATE OF CORRECTION

| | | |
|---|---|---|
| PATENT NO. | : 8,311,096 B2 | Page 1 of 1 |
| APPLICATION NO. | : 12/512704 | |
| DATED | : November 13, 2012 | |
| INVENTOR(S) | : Jens Rusch-Ihwe | |

It is certified that error appears in the above-identified patent and that said Letters Patent is hereby corrected as shown below:

In the Drawings

SHEET 6

Fig. 6, "Coating" should read --Coding--.

SHEET 8

Fig. 8, "RS Kode," should read --RS Code,--.

In the Specification

COLUMN 5

Line 21, "times lots." should read --timeslots.--; and
    Line 26, "is" should read --are--.

COLUMN 6

Line 9, "and" should be deleted.

Signed and Sealed this
Fifteenth Day of April, 2014

Michelle K. Lee
*Deputy Director of the United States Patent and Trademark Office*